(12) United States Patent
Cha et al.

(10) Patent No.: US 12,027,486 B2
(45) Date of Patent: Jul. 2, 2024

(54) SUBSTRATE BONDING APPARATUS

(71) Applicant: L TRIN.CO., LTD, Hwaseong-si (KR)

(72) Inventors: Yong Won Cha, Seoul (KR); Mi Ok Cho, Suwon-si (KR); Ji Soo Cho, Hwaseong-si (KR); Dae Hyeon Kim, Gunpo-si (KR)

(73) Assignee: L TRIN.CO., LTD, Hwaseong-si (KR)

( * ) Notice: Subject to any disclaimer, the term of this patent is extended or adjusted under 35 U.S.C. 154(b) by 432 days.

(21) Appl. No.: 17/413,560

(22) PCT Filed: Jul. 19, 2019

(86) PCT No.: PCT/KR2019/008919
§ 371 (c)(1),
(2) Date: Jun. 13, 2021

(87) PCT Pub. No.: WO2020/122344
PCT Pub. Date: Jun. 18, 2020

(65) Prior Publication Data
US 2022/0052018 A1 Feb. 17, 2022

(30) Foreign Application Priority Data
Dec. 14, 2018 (KR) .................. 10-2018-0161689

(51) Int. Cl.
*H01L 23/00* (2006.01)
*G06T 7/00* (2017.01)
*H04N 23/90* (2023.01)

(52) U.S. Cl.
CPC .............. *H01L 24/75* (2013.01); *G06T 7/001* (2013.01); *H04N 23/90* (2023.01); *G06T 2207/30204* (2013.01); *H01L 2224/75753* (2013.01)

(58) Field of Classification Search
CPC ..... B29C 65/7817; B29C 66/98; H01L 24/75; H01L 2224/75753; H01L 2224/03005;
(Continued)

(56) References Cited

U.S. PATENT DOCUMENTS

| 4,046,985 A * | 9/1977 | Gates ............ H01L 21/681 225/2 |
| 2003/0173033 A1* | 9/2003 | Lee ............... B32B 38/1841 156/382 |
| 2010/0231928 A1* | 9/2010 | Tanaka .......... H01L 21/67092 355/72 |

FOREIGN PATENT DOCUMENTS

| JP | 2005-251972 A | 9/2005 |
| KR | 10-0914446 B1 | 8/2009 |

(Continued)

*Primary Examiner* — John L Goff, II
(74) *Attorney, Agent, or Firm* — Maschoff Brennan

(57) ABSTRACT

The present invention relates to a substrate aligning device for bonding a first substrate (100) and a second substrate (200), wherein the first substrate (100) and the second substrate (200) have respective bonding surfaces via which the first substrate (100) and the second substrate (200) are bonded face-to-face with each other, and respective non-bonding surfaces which are located on the reverse sides from the bonding surfaces. The substrate alignment device comprises: a first substrate (100) having a first bonding surface (110) and a first non-bonding surface (120) located on the reverse side from the first bonding surface (110); a second substrate (200) having a second bonding surface (210) and a second non-bonding surface (220) located on the reverse side from the second bonding surface (210); a first holder (300) formed such that the first non-bonding surface (120) of the first substrate (100) is seated thereon; and a second holder (400) formed such that the second non-bonding surface (220) of the second substrate (200) is seated thereon. The first substrate (100) and the second substrate (200) are (Continued)

(a)

(b)

aligned by bringing the first holder (300) and the second holder (400) toward each other so that the first bonding-surface (110) and the second bonding-surface (210) come into close contact with each other. Since the alignment can be achieved without penetrating an opaque substrate, existing fine alignment limitations can be eliminated, and misalignment can be prevented.

6 Claims, 6 Drawing Sheets

(58) Field of Classification Search
CPC . H01L 2224/03015; H01L 2224/11005; H01L 2224/11015; H01L 2224/27005; H01L 2224/27015; H01L 2224/8013; H01L 2224/80132; H01L 2224/8113; H01L 2224/81132; H01L 2224/8213; H01L 2224/82132; H01L 2224/8313; H01L 2224/83132; H01L 2224/8413; H01L 2224/84132; H01L 2224/8513; H01L 2224/85132; H01L 2224/8613; H01L 2224/86132; H01L 21/18; H01L 21/67; H01L 21/68; H01L 21/67121; H01L 21/67092; H01L 21/185; H01L 21/67259; H01L 21/67282; H01L 21/682; H01L 23/544; G06T 7/001; G06T 2207/30204; H04N 23/90
USPC .................................................. 156/64, 378
See application file for complete search history.

(56) References Cited

FOREIGN PATENT DOCUMENTS

| | | |
|---|---|---|
| KR | 10-2010-0074126 A | 7/2010 |
| KR | 10-2011-0021292 A | 3/2011 |
| KR | 10-2016-0089020 A | 7/2016 |
| WO | 2014/112512 A1 | 7/2014 |

* cited by examiner (a)

(b)

(c)

(d)

(a)

(b)

(a)

(b)

SUBSTRATE BONDING APPARATUS

FIELD OF INVENTION

The present invention relates to a substrate alignment apparatus, and more particularly to a substrate alignment apparatus for precisely aligning two different substrates using a substrate holder.

BACKGROUND OF INVENTION

Substrate bonding technology has been used in technology for manufacturing a semiconductor, a LED, micro electromechanical systems (MEMS), wafer level package (WLP), and a high bandwidth memory (HBM), multi-chip stacking technology, and the like. Conventionally, substrates are bonded using adhesives and then wirings are formed, and accordingly, it is not required to precisely align substrates.

However, recently, technology for bonding substrates and simultaneously achieving electrical connection between the substrates by directly connecting the substrates through wirings formed thereon has been used, and accordingly, it is necessary to precisely align substrates before the substrates are bonded.

For example, substrates are precisely aligned outside a bonding chamber, the aligned substrates are moved to the bonding chamber without change, and then a bonding process may be performed.

There are broadly four substrate alignment methods that are currently used.

Thereamong, Korean Patent Publication No. 10-0914446 discloses a substrate bonding apparatus for aligning and stacking substrates arranged at predetermined alignment positions by acquiring reference marks indicated on the substrates as an optical image through an imager and then positioning the substrates at the predetermined alignment positions.

FIG. 1 is a schematic cross-sectional view showing a conventional substrate alignment method.

This is now described in detail with reference to FIG. 1. Among conventional substrate alignment methods, as disclosed in FIG. 1A and Korean Patent Publication No. 10-0914446, a method in which one of at least two substrates is transparent or transmissive and the substrates are aligned by reading an alignment key or an alignment mark on another substrate together has the highest alignment accuracy.

However, when both substrates to be aligned are not transparent or transmissive, it is disadvantageously impossible to use the method, and when a substrate is opaque and an alignment key or an alignment mark is present on contact surfaces, it is impossible to accurately view two alignment keys or alignment marks, and thus there is a problem in that it is difficult to accurately align the substrates.

As shown in FIG. 1B, there is a method of aligning two substrates by forming an alignment key or an alignment mark on a rear surface of one of the two substrates, but when it is impossible to generate an alignment key or an alignment mark on a rear surface of a substrate or there is a limit in generating the alignment key or the alignment mark, the method may not be capable of being used and alignment accuracy is lower than in the aforementioned alignment method.

As shown in FIG. 1C, there is a method of aligning two substrates using alignment keys or alignment marks on the substrate by transmitting light through the two substrates using an IR camera, but alignment accuracy is disadvantageously low due to low resolution based on the characteristics of the IR camera and distortion in a process in which light is transmitted through the substrates to recognize the alignment keys or the alignment marks.

As shown in FIG. 1D, there is an alignment method in which alignment keys or alignment marks are formed on respective substrates using two pairs of cameras that face each other, but alignment accuracy is disadvantageously low compared with the method having the highest alignment accuracy.

SUMMARY OF INVENTION

Technical Problem to be Solved

To overcome the aforementioned problems, the present invention provides a substrate alignment apparatus for aligning two substrates using different substrate holders and an alignment structure having high alignment accuracy using the substrate alignment apparatus.

The present invention provides a structure for checking and accurately aligning two alignment keys or alignment marks when both substrates are opaque and the alignment keys or the alignment marks are present on contact surfaces.

However, the object of the present invention is not limited to the aforementioned object, and one of ordinary skill in the art may understand another object that is not mentioned from the following description.

In addition, in the present invention, in order to accurately bond two substrates, the two substrates need to be accurately aligned and then bonded to complete the work, and accordingly, alignment and bonding may be simultaneously performed and thus may have the same meaning, and thus alignment and bonding may be interchangeably used hereinafter.

Technical Solution

Therefore, the present invention provides a substrate alignment apparatus including a first substrate 100 and a second substrate 200 being bonded to each other, and the first substrate 100 and the second substrate 200 being classified into adhesive surfaces that are bonded to each other while the first substrate 100 and the second substrate 200 face each other and non-adhesive surfaces positioned at opposite sides of the adhesive surfaces: the first substrate 100 including a first adhesive surface 110 and a first non-adhesive surface 120 positioned at an opposite side to a first adhesive surface 110; the second substrate 200 including a second adhesive surface 210 and a second non-adhesive surface 220 positioned at an opposite side to a second adhesive surface 210; a first holder 300 formed to accommodate the first non-adhesive surface 120 of the first substrate 100 thereon; a second holder 400 formed to accommodate the second non-adhesive surface 220 formed to accommodate the second non-adhesive surface 220 of the second substrate 200 thereon, wherein the first substrate 100 and the second substrate 200 are aligned by moving the first holder 300 and the second holder 400 closely to each other to bring the first adhesive surface 110 and the second adhesive surface 210 into close contact with each other.

The substrate alignment apparatus may further include one or more first alignment marks 130 formed on the first adhesive surface 110 of the first substrate 100; one or more second alignment marks 230 formed on the second adhesive surface 210 of the second substrate 200; one or more third alignment marks 330 formed at predetermined positions of the first holder 300; and one or more fourth alignment marks 430 formed at predetermined positions of the second holder 400, first images of the first alignment mark 130 and the third alignment mark 330 are acquired, second images of the second alignment mark 230 and the fourth alignment mark 430 are acquired, and the first substrate 100 and the second substrate 200 are aligned by moving the first holder 300 and the second holder 400 closely to each other to bring the first adhesive surface 110 and the second adhesive surface 210 into close contact with each other using the first and second images.

The substrate alignment apparatus may further include a first camera unit 500 configured to acquires images of the first alignment mark 130 and the third alignment mark 330; and a second camera unit 510 configured to acquires images of the second alignment mark 230 and the fourth alignment mark 430; and an analyzer 530 configured to analyze an alignment error of each alignment mark, wherein each alignment error is analyzed through the analyzer 530 and the first substrate 100 and the second substrate 200 are aligned by moving the first holder 300 and the second holder 400 closely to each other to bring the first adhesive surface 110 and the second adhesive surface 210 into close contact with each other at desired positions.

The first holder 300 may include a first accommodation surface 310 formed to accommodate the first non-adhesive surface 120 thereon in a form of a plate for supporting the first substrate 100; and a first outer surface 320 positioned outside the first accommodation surface 310, wherein the second holder 400 includes: a second accommodation surface 410 formed to accommodate the second non-adhesive surface 220 thereon in a form of a plate for supporting the second adhesive surface 210 of the second substrate 200; a second outer surface 420 positioned outside the second accommodation surface 410, and wherein the first adhesive surface 110 of the first substrate 100 accommodated on the first accommodation surface 310 of the first holder 300 and the second adhesive surface 210 of the second substrate 200 accommodated on the second accommodation surface 410 of the second holder 400 are arranged to face each other, and then the first substrate 100 and the second substrate 200 are aligned by moving the first holder 300 and the second holder 400 closely to each other to bring the first adhesive surface 110 and the second adhesive surface 210 into close contact with each other.

In this case, the size of the first holder 300 or the second holder 400 may be equal to or larger than the size of the first substrate 100 or the second substrate 200, but the present invention is not limited thereto.

The first holder 300 and/or the second holder 400 may include a driver for moving the first holder 300 and/or the second holder 400, when a perpendicular direction to the first accommodation surface 310 of the first holder 300 is a z-axis direction and directions that are positioned in parallel to the first accommodation surface 310 and perpendicular to each other are an x-axis direction and a y-axis direction, the driver 550 may compensate for the alignment error analyzed through the analyzer 530 by moving the first holder 300 and/or the second holder 400 in the x-axis, y-axis, and z-axis directions or rotating the first holder 300 and/or the second holder 400 in the z-axis direction, and thus may align the first substrate 100 and the second substrate 200 by moving the first holder 300 and the second holder 400 closely to each other to bring the first adhesive surface 110 and the second adhesive surface 210 into close contact with each other at desired positions.

The analyzer 530 may analyze a first alignment error corresponding to alignment errors of the first alignment mark 130 and the third alignment mark 330 from the images acquired from the first alignment mark 130 and the third alignment mark 330, acquired from the first camera unit 500, may analyze a second alignment error corresponding to alignment errors of the second alignment mark 230 and the fourth alignment marks 430 from the images acquired from the second alignment mark 230 and the fourth alignment marks 430 from the images acquired from the second alignment mark 230 and the fourth alignment mark 430, acquired from the second camera unit 510, may analyze positions of the third alignment mark 330 and the fourth alignment mark 430 through the third camera unit, and may then acquire a moving value for moving the first holder 300 and/or the second holder 400 to match the first alignment mark 130 of the first substrate 100 and the second alignment mark 230 of the second substrate 200 in consideration of the first alignment error and the second alignment error, may move the first holder 300 and/or the second holder 400 through the driver 550 by applying the acquired moving value, and may align the first substrate 100 and the second substrate 200 to make the first alignment mark 130 of the first adhesive surface 110 and the second alignment mark 230 of the second adhesive surface 210 correspond to each other and be in close contact with each other.

The first substrate 100 and the second substrate 200 may be opaque, the first alignment mark 130 of the first substrate 100 may be formed on the first adhesive surface 110, and the second alignment mark 230 of the second substrate 200 may be formed on the second adhesive surface 210, and accordingly, when the first substrate 100 and the second substrate 200 are bonded to each other, the first alignment mark 130 may not be accurately viewed, and thus a moving value for moving the first holder 300 and/or the second holder 400 may be calculated to acquire the images of the first alignment mark 130 and the third alignment mark 330 to analyze the first alignment error, to acquire the images of the second alignment mark 230 and the fourth alignment mark 430 to analyze the second alignment error, and to acquire the images of the third alignment mark 330 and the fourth alignment mark 430 to compensate for the first alignment error and the second alignment error.

To simultaneously acquire the images of the third alignment mark 330 and the fourth alignment mark 430, a through hole or a transparent hole 540 filled with a transparent material may be formed in a portion at which the third alignment mark 330 of the first holder 300 is formed or a portion at which the fourth alignment mark 430 of the second holder 400 is formed, but the present invention is not limited thereto.

The third camera unit may be separately configured, or may be used by being replaced with the first camera unit 500 or the second camera unit 510.

When the first substrate 100 is accommodated on the first accommodation surface 310 of the first holder 300, the first adhesive surface 110 may protrude based on the first outer surface 320 of the first holder 300 or may be positioned at the same level as the first outer surface 320, and when the second substrate 200 is accommodated on the second accommodation surface 410 of the second holder 400, the second adhesive surface 210 may protrude based on the second outer surface 420 of the second holder 400 or may be positioned at the same level as the second outer surface 420, and accordingly, when the first outer surface 320 of the first holder 300 and the second outer surface 420 of the second holder 400 are brought into close contact with each other, the first adhesive surface 110 of the first substrate 100 and the second adhesive surface 210 of the second substrate 200 may be aligned by moving the first adhesive surface 110 and the second adhesive surface 210 closely to each other.

In the above case, a relative level between the first holder 300 and the first outer surface 320 and a relative level between the second holder 400 and the second outer surface 420 may be limited, but it would be obvious that this may be modified depending on the current situation if necessary.

The number of the first alignment marks 130 and the number of the third alignment marks 330 may be the same or different, the number of the second alignment marks 230 and the number of the fourth alignment marks 430 may also be the same or different.

The first camera unit 500 may be provided in plural in order to separately recognize the positions of the first alignment mark 130 and the third alignment mark 330 or may be provided singularly to recognize the positions of the first alignment mark and the third alignment mark by acquiring the images of the first alignment mark and the third alignment mark while moving one camera.

Similarly, the second camera unit 510 may be provided in plural in order to separately recognize the positions of the second alignment mark 230 and the fourth alignment mark 430 or may be provided singularly to recognize the positions of the second alignment mark and the fourth alignment mark by acquiring the images of the second alignment mark and the fourth alignment mark while moving one camera.

Features and advantages of the present invention will be more apparent from the following detailed description based on the accompanying drawings.

Prior to this, terms or words used in the present specification and claims should not be interpreted in a conventional and dictionary meaning, and the terms or the words may be interpreted as having meanings and concepts consistent with the technical idea of the present invention based on a principle in which the inventor is capable of appropriately defining the concept of the terms in order to describe their own invention in the best way.

Effect of Invention

As described above, according to the present invention, it may be possible to align substrates without transmitting light there through using a substrate holder, and thus existing fine alignment limitations may be removed, and all the a fore mentioned alignment methods may be replaced with the present invention.

The substrates may be dangling-bonded to each other due to surface energy between the substrates or may be mechanically fixed, and thus the substrates may be prevented from being misaligned due to movement of the substrates and wirings formed on the substrate may be more precisely aligned, thereby improving process reliability.

BEST MODE

Figure 1:
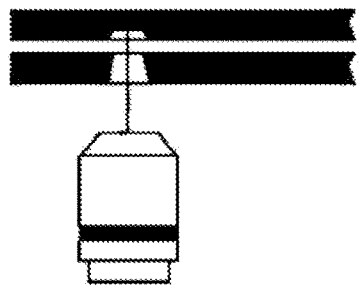
FIG. 1 is a schematic cross-sectional view showing a conventional substrate alignment method.
Figure 1:
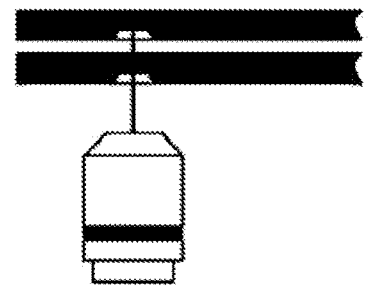
Figure 1:
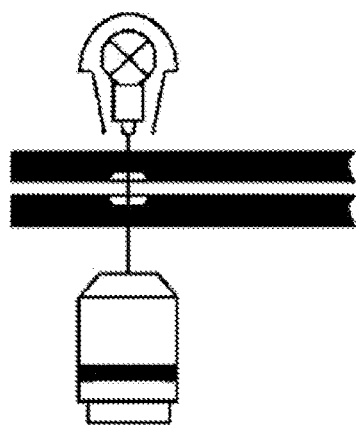
Figure 1:
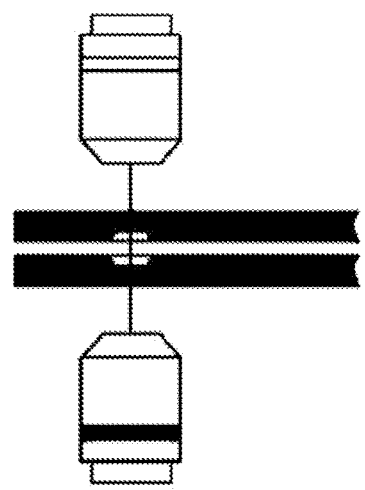

Reference will now be made in detail to the preferred embodiments of the present invention, examples of which are illustrated in the accompanying drawings. Throughout this specification, sizes, shapes, or the like of components shown in the drawings may be exaggerated for clarity and convenience of description.

The terms used in the specification are defined in consideration of functions used in the present invention, and can be changed according to the intent or conventionally used methods of clients, operators, and users. Accordingly, definitions of the terms should be understood on the basis of the entire description of the present specification.

In addition, the following examples are not intended to limit the scope of the present invention, but are merely illustrative of the elements presented in the claims of the present invention, and are included in the technical idea throughout the specification of the present invention and the composition of the claims. Embodiments including elements that can be substituted with equivalents in elements may be included in the scope of the present invention.

Figure 2:
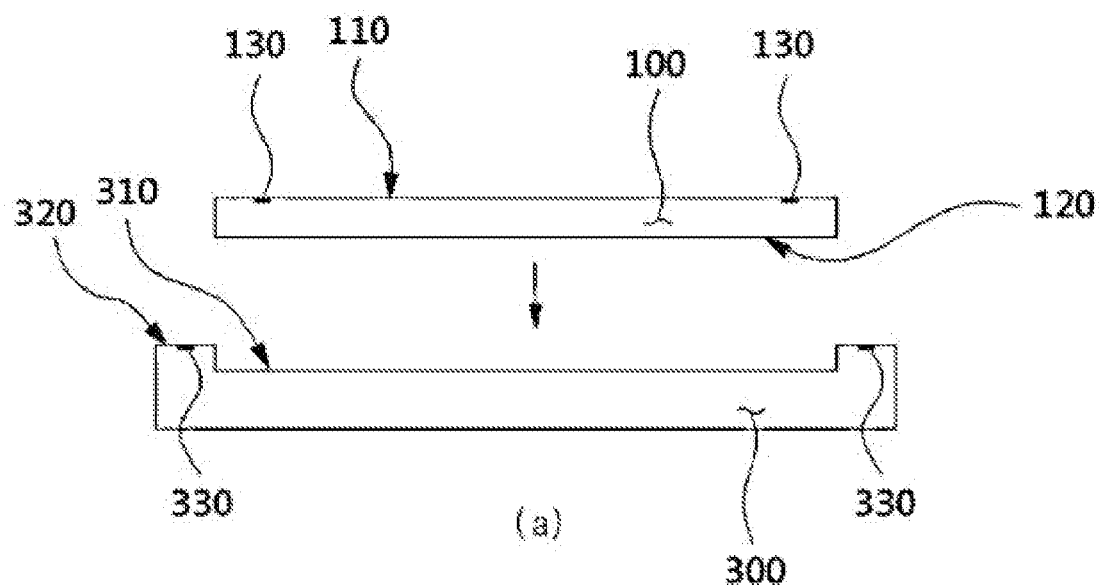
FIG. 2 is a schematic diagram showing the state in which a substrate is positioned on a substrate alignment apparatus according to a first embodiment of the present invention.
Figure 2:
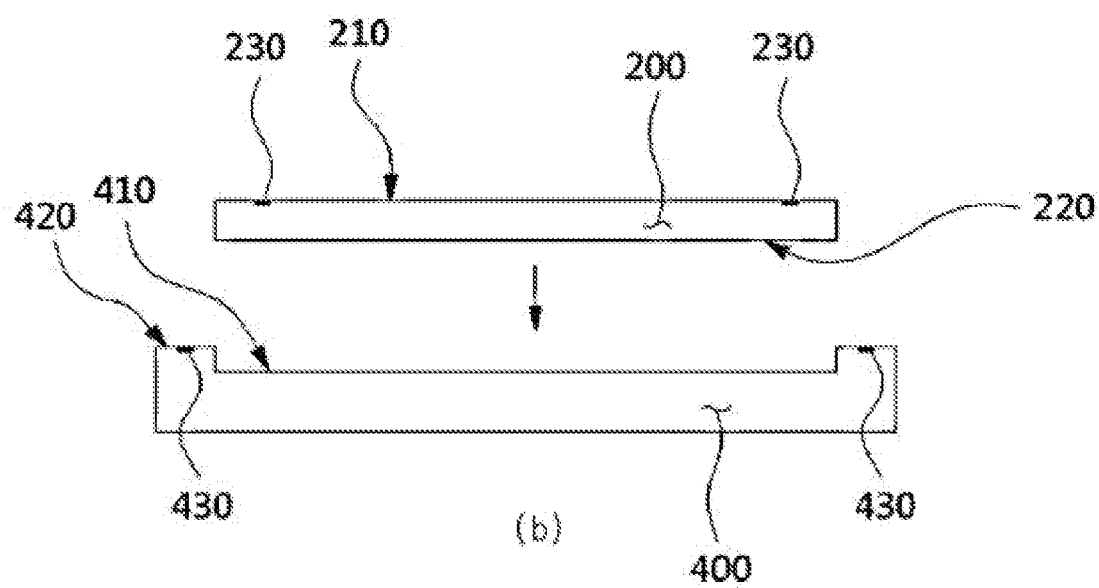

FIG. 2 is a schematic diagram showing the state in which a substrate is positioned on a substrate alignment apparatus according to a first embodiment of the present invention.

Referring to FIG. 2, according to the present invention, a first substrate 100 and a second substrate 200 may be bonded to each other, and the first substrate 100 and the second substrate 200 may be classified into adhesive surfaces that are bounded to each other while the first substrate 100 and the second substrate 200 face each other and non-adhesive surfaces positioned at opposite sides of the adhesive surfaces.

In more detail, the substrate alignment apparatus may include the first substrate 100 including a first adhesive surface 110 and a first non-adhesive surface 120 positioned at an opposite side to the first adhesive surface 110, the second substrate 200 including a second adhesive surface 210 and a second non-adhesive surface 220 positioned at an opposite side to the second adhesive surface 210, a first holder 300 formed to accommodate the first non-adhesive surface 120 of the first substrate 100 thereon, and a second holder 400 formed to accommodate the second non-adhesive surface 220 of the second substrate 200 thereon, and in this case, the first substrate 100 and the second substrate 200 may be aligned by moving the first holder 300 and the second holder 400 closely to each other to bring the first adhesive surface 110 and the second adhesive surface 210 into close contact with each other.

The first adhesive surface 110 of the first substrate 100 may include one or more first alignment marks 130, and the second adhesive surface 210 of the second substrate 200 may include one or more second alignment marks 230.

The substrate alignment apparatus may include one or more third alignment marks 330 formed at predetermined positions of the first holder 300 and one or more fourth alignment marks 430 formed at predetermined positions of the second holder 400.

The number of the first alignment marks 130 and the number of the third alignment marks 330 may be the same or different, the number of the second alignment marks 230 and the number of the fourth alignment marks 430 may also be the same or different.

In the above case, the first holder 300 may include a first accommodation surface 310 formed to accommodate the first non-adhesive surface 120 thereon in the form of a plate for supporting the first substrate 100, and a first outer surface 320 positioned outside the first accommodation surface 310, and in this case, the second holder 400 may include a second accommodation surface 410 formed to accommodate the second non-adhesive surface 220 thereon in the form of a plate for supporting the second adhesive surface 210 of the second substrate 200, and a second outer surface 420 positioned outside the second accommodation surface 410.

Figure 3:
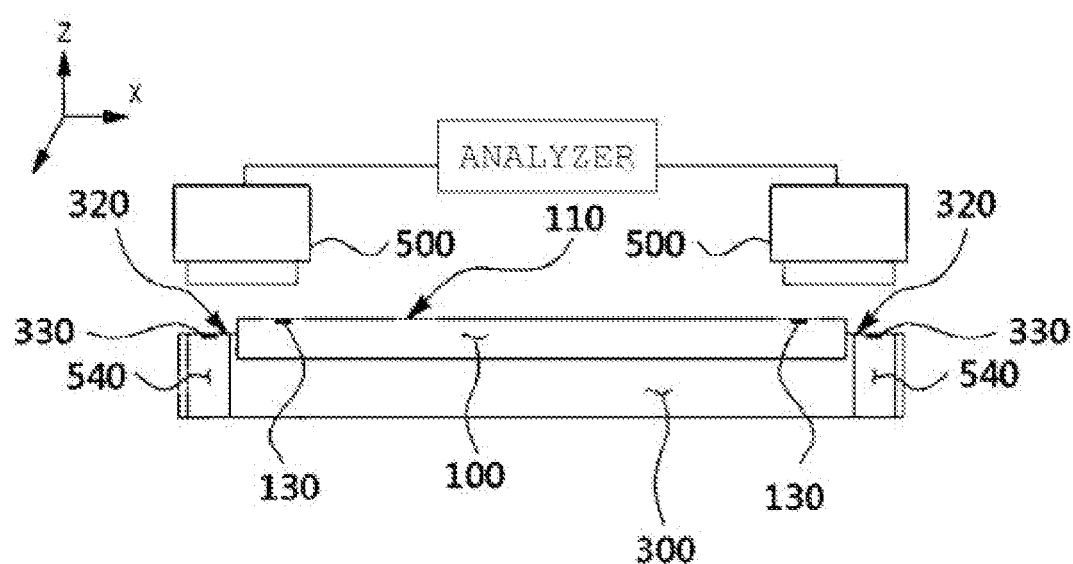
FIG. 3 is a diagram showing the states in which a first alignment error and a second alignment error are acquired in a substrate alignment apparatus according to a first embodiment of the present invention.
Figure 3:
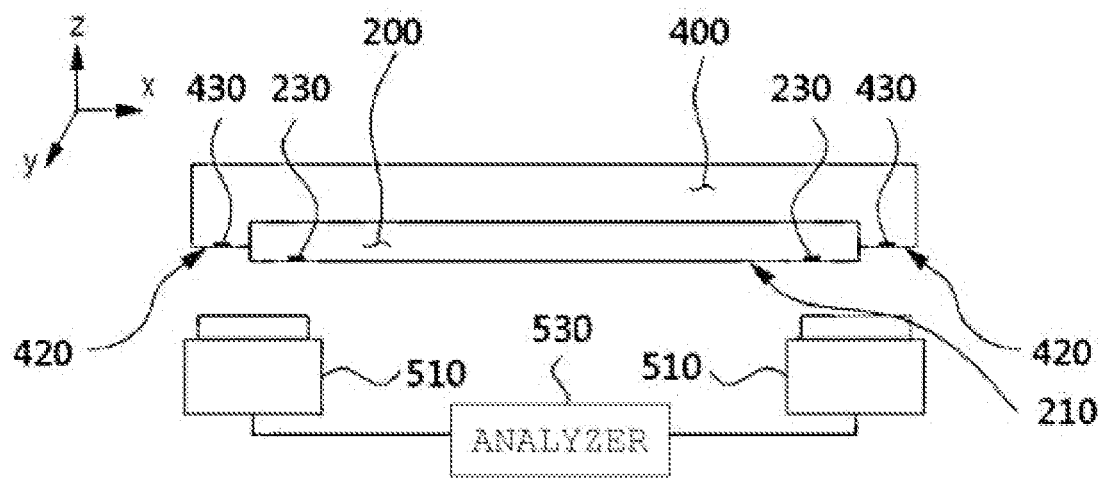

FIG. 3 is a diagram showing the states in which a first alignment error and a second alignment error are acquired in a substrate alignment apparatus according to a first embodiment of the present invention.

Referring to FIG. 3, when the first substrate 100 is accommodated on the first accommodation surface 310 of the first holder 300, the first adhesive surface 110 may protrude based on the first outer surface 320 of the first holder 300 or may be positioned at the same level as the first outer surface 320, and when the second substrate 200 is accommodated on the second accommodation surface 410 of the second holder 400, the second adhesive surface 210 may protrude based on the second outer surface 420 of the second holder 400 or may be positioned at the same level as the second outer surface 420.

The substrate alignment apparatus may include a first camera unit 500 for acquiring images of the first alignment mark 130 and the third alignment mark 330, a second camera unit 510 for acquiring images of the second alignment mark 230 and the fourth alignment mark 430, and an analyzer 530 for analyzing an alignment error of each alignment mark, and may analyze each alignment error through the analyzer 530 and may align the first substrate 100 and the second substrate 200 by moving the first holder 300 and the second holder 400 closely to each other to bring the first adhesive surface 110 and the second adhesive surface 210 into close contact with each other at desired positions.

FIG. 3A illustrates the state in which a first alignment error is acquired, and FIG. 3B illustrates the state in which a second alignment error is acquired.

According to the present invention, as shown in FIG. 3A, first images of the first alignment mark 130 and the third alignment mark 330 may be acquired, and as shown in FIG. 3B, second images of the second alignment mark 230 and the fourth alignment mark 430 may be acquired, and the first substrate 100 and the second substrate 200 may be aligned by moving the first holder 300 and the second holder 400 closely to each other to bring the first adhesive surface 110 and the second adhesive surface 210 into close contact with each other using the first and second images.

In the above case, the analyzer 530 may analyze first alignment errors of the first alignment mark 130 and the third alignment mark 330 from the images of the first alignment mark 130 and the third alignment mark 330, acquired from the first camera unit 500 shown in FIG. 3A, and may analyze second alignment errors of the second alignment mark 230 and the fourth alignment mark 430 from the images of the second alignment mark 230 and the fourth alignment mark 430, acquired from the second camera unit 510 shown in FIG. 3B.

Figure 4:
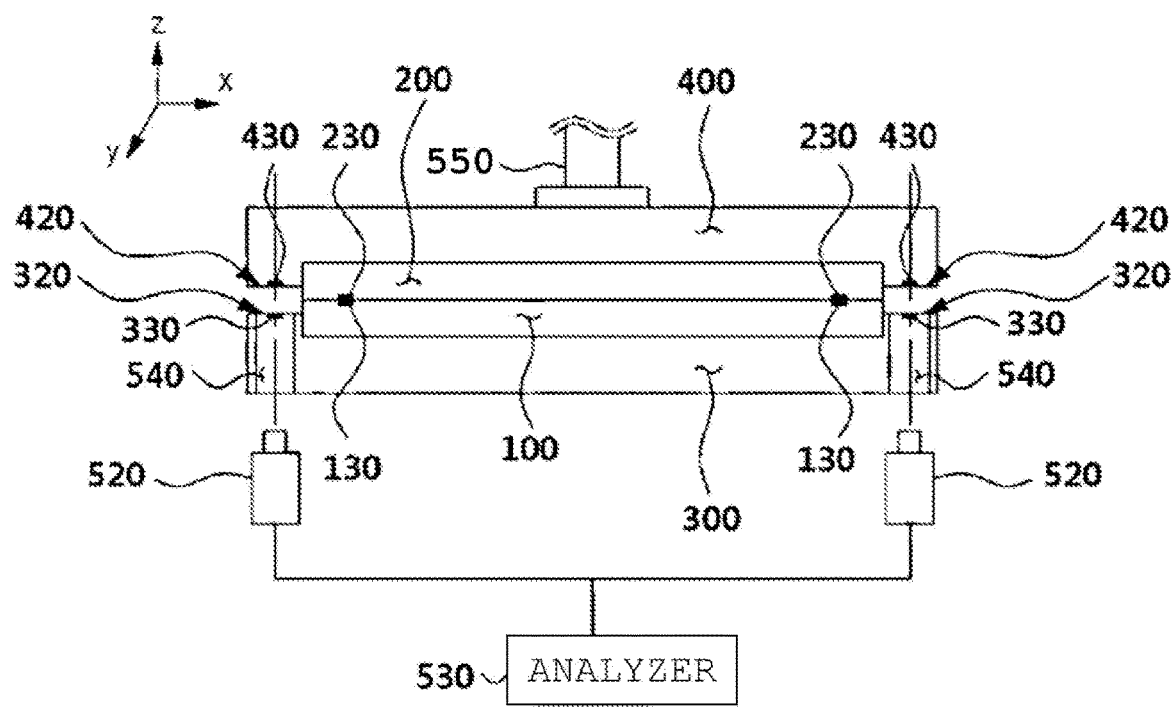
FIG. 4 is a diagram showing the state in which a substrate alignment apparatus according to the present invention compensates for the first alignment error and the second alignment error.

FIG. 4 is a diagram showing the state in which a substrate alignment apparatus according to the present invention compensates for the first alignment error and the second alignment error.

Figure 6:
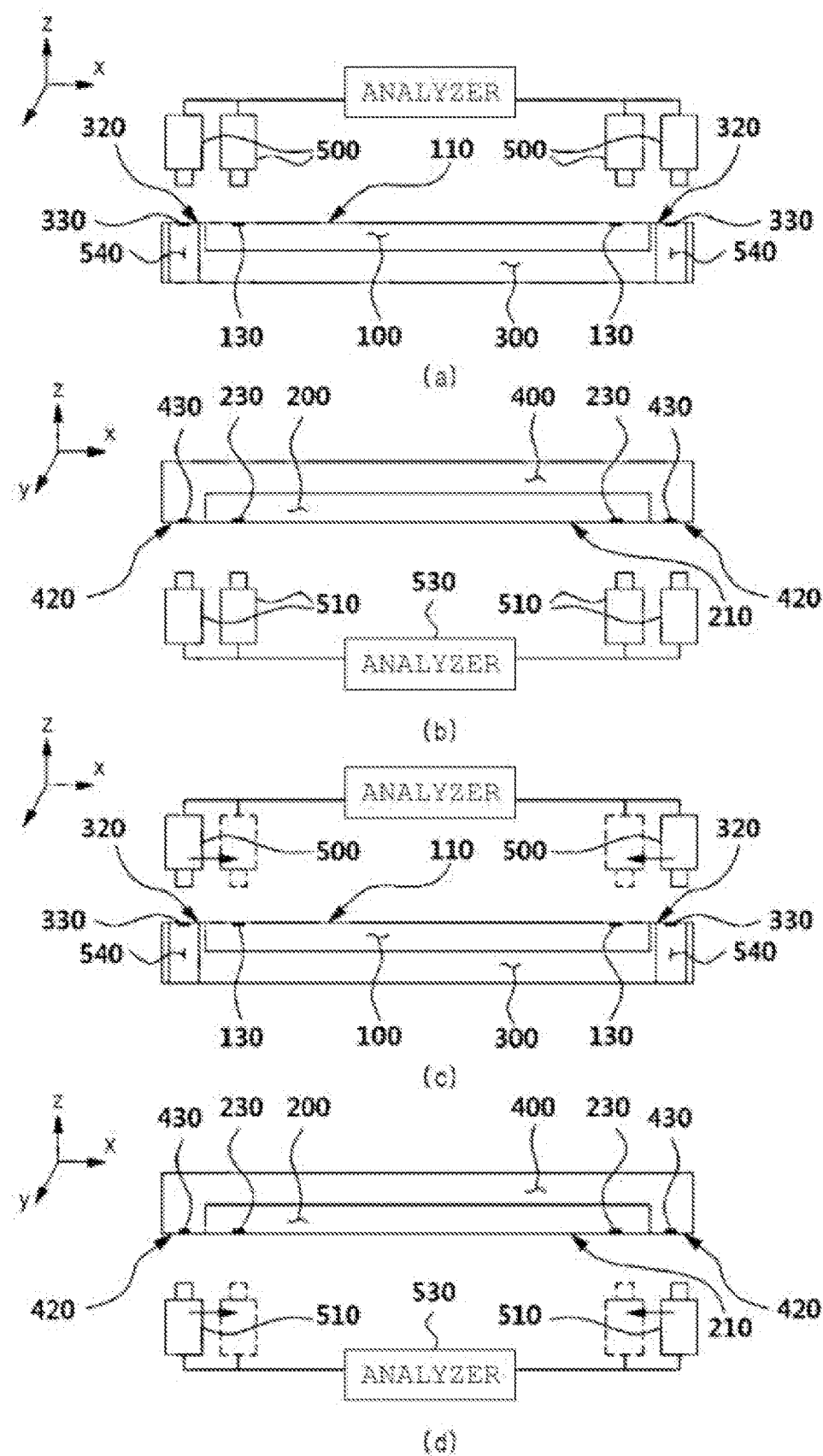
FIG. 6 shows a procedure of acquiring a first alignment error and a second alignment error by a substrate alignment apparatus according to a second embodiment of the present invention and a procedure of acquiring a first alignment error and a second alignment error by a substrate alignment apparatus according to a third embodiment of the present invention.

FIG. 6 shows a procedure of acquiring a first alignment error and a second alignment error by a substrate alignment apparatus according to a second embodiment of the present invention and a procedure of acquiring a first alignment error and a second alignment error by a substrate alignment apparatus according to a third embodiment of the present invention.

Referring to FIG. 6, when the first substrate 100 is accommodated on the first accommodation surface 310 of the first holder 300, the first adhesive surface 110 may be positioned at the same level as the first outer surface 320 of the first holder 300 or may protrude based on the first outer surface 320, and when the second substrate 200 is accommodated on the second accommodation surface 410 of the second holder 400, the second adhesive surface 210 may be positioned at the same level as the second outer surface 420 of the second holder 400 or may protrude based on the second outer surface 420.

Referring to FIG. 4, in the above case, the first holder 300 and/or the second holder 400 may include a driver 550 for moving the first holder 300 and/or the second holder 400.

In the above case, when a perpendicular direction to the first accommodation surface 310 of the first holder 300 is a z-axis direction and directions that are positioned in parallel to the first accommodation surface 310 and perpendicular to each other are an x-axis direction and a y-axis direction, the driver 550 may compensate for the alignment error analyzed through the analyzer 530 by moving the first holder 300 and/or the second holder 400 in the x-axis, y-axis, and z-axis directions or rotating the first holder 300 and/or the second holder 400 in the z-axis direction, and thus may align the first substrate 100 and the second substrate 200 by moving the first holder 300 and the second holder 400 closely to each other to bring the first adhesive surface 110 and the second adhesive surface 210 into close contact with each other at desired positions.

In more detail, the first adhesive surface 110 of the first substrate 100 accommodated on the first accommodation surface 310 of the first holder 300 shown in FIG. 3A and the second adhesive surface 210 of the second substrate 200 accommodated on the second accommodation surface 410 of the second holder 400 shown in FIG. 3B may be arranged to face each other, and then the first substrate 100 and the second substrate 200 may be aligned by moving the first holder 300 and the second holder 400 closely to each other to bring the first adhesive surface 110 and the second adhesive surface 210 into close contact with each other.

As shown in FIG. 3, the first alignment error and the second alignment error may be acquired through the first camera unit and the second camera unit, respectively, as shown in FIG. 4, the positions of the third alignment mark 330 and the fourth alignment mark 430 may be analyzed through a third camera unit, a moving value for moving the first holder 300 and/or the second holder 400 may then be acquired in order to match the first alignment mark 130 of the first substrate 100 and the second alignment mark 230 of the second substrate 200 in consideration of the first alignment error and the second alignment error, and the first holder 300 and/or the second holder 400 may be moved through the driver 550 by applying the acquired moving value and may align the first substrate 100 and the second substrate 200 to make the first alignment mark 130 of the first adhesive surface 110 and the second alignment mark 230 of the second adhesive surface 210 correspond to each other and be in close contact with each other.

When the moving value is acquired and the first holder and/or the second holder are moved through the driver, this may be easily implemented by one of ordinary skill in the art with reference to the description of the present specification, and thus a detailed description thereof is omitted.

In the above case, when the first outer surface 320 of the first holder 300 and the second outer surface 420 of the second holder 400 are brought into close contact with each other, the first adhesive surface 110 of the first substrate 100 and the second adhesive surface 210 of the second substrate 200 may be aligned by moving the first adhesive surface 110 and the second adhesive surface 210 closely to each other.

In this case, the first substrate 100 and the second substrate 200 may be opaque, the first alignment mark 130 of the first substrate 100 may be formed on the first adhesive surface 110, and the second alignment mark 230 of the second substrate 200 may be formed on the second adhesive surface 210, and accordingly, when the first substrate 100 and the second substrate 200 are bonded to each other, the first alignment mark 130 and the second alignment mark 230 may not be accurately viewed, and thus a moving value for moving the first holder 300 and/or the second holder 400 may be calculated in order to acquire the images of the first alignment mark 130 and the third alignment mark 330 to analyze the first alignment error, to acquire the images of the second alignment mark 230 and the fourth alignment mark 430 to analyze the second alignment error, and to acquire the images of the third alignment mark 330 and the fourth alignment mark 430 to compensate for the first alignment error and the second alignment error.

In this case, according to the first embodiment of the present invention, when the images of the first alignment mark 130 and the second alignment mark 230 are acquired, it may be advantageous to simultaneously acquire and analyze images using one camera if necessary, and accordingly, the images of the first alignment mark 130 and the second alignment mark 230 may be simultaneously acquired using one camera.

When the images of the third alignment mark 330 and the fourth alignment mark 430 are acquired, the images of the third alignment mark 330 and the fourth alignment mark 430 may also be acquired using one camera as described above.

According to the second embodiment of the present invention, as shown in FIGS. 6A and 6B, when the images of the first alignment mark 130 and the second alignment mark 230 are acquired, the images of the first alignment mark 130 and the second alignment mark 230 may be respectively acquired and analyzed using a plurality of cameras if necessary.

When the images of the third alignment mark 330 and the fourth alignment mark 430 are acquired, the images of the third alignment mark 330 and the fourth alignment mark 430 may also be respectively acquired using a plurality of cameras as described above.

According to the third embodiment of the present invention, as shown in FIGS. 6C and 6D, when the images of the first alignment mark 130 and the second alignment mark 230 are acquired, the images of the first alignment mark 130 and the second alignment mark 230 may be acquired and analyzed by moving one camera if necessary.

Similarly, when the images of the third alignment mark 330 and the fourth alignment mark 430 are acquired, the images of the third alignment mark 330 and the fourth alignment mark 430 may also be acquired by moving one camera as described above.

According to the present invention, in order to simultaneously acquire the images of the third alignment mark 330 and the fourth alignment mark 430, a through hole or a transparent hole 540 filled with a transparent material may be formed in a portion at which the third alignment mark 330 of the first holder 300 is formed or a portion at which the fourth alignment mark 430 of the second holder 400 is formed.

In the above case, the third camera unit may be separately configured, or may be used by being replaced with the first camera unit 500 or the second camera unit 510 shown in FIG. 3.

The first camera unit 500 may be provided in plural in order to separately analyze the first alignment mark 130 and the third alignment mark 330 or may be provided singularly to analyze each of the first alignment mark and the third alignment mark and the number of the second camera units 510 may be the same or different from the number of the second alignment marks 230 or the fourth alignment marks 430.

Figure 5:
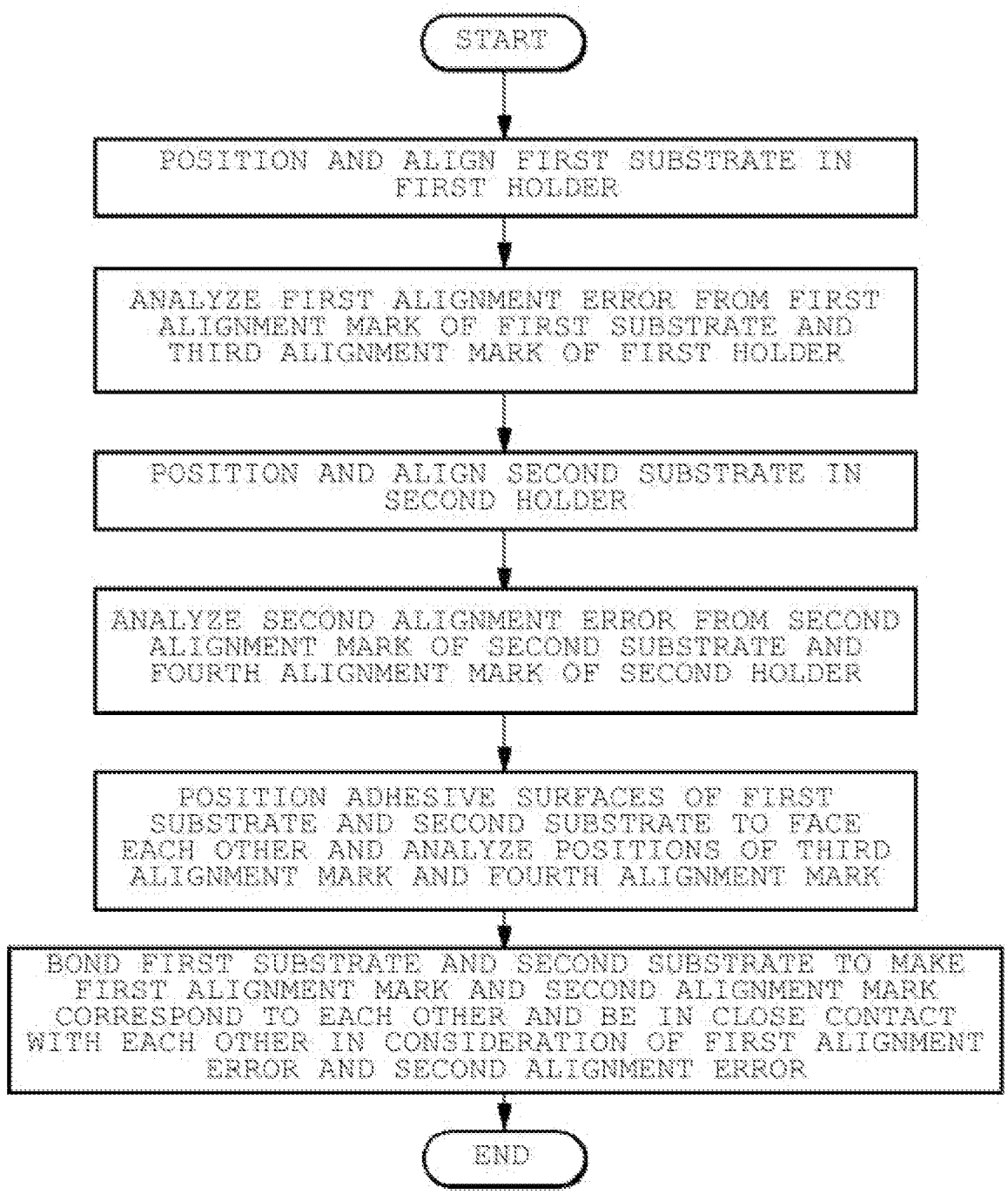
FIG. 5 is a schematic flow chart of a procedure of aligning a substrate according to a first embodiment of the present invention.

FIG. 5 is a schematic flow chart of a procedure of aligning a substrate according to a first embodiment of the present invention.

The procedure of aligning a substrate is now described with reference to FIG. 4, and a first substrate may be positioned and aligned in a first holder, and the analyzer may analyze the first alignment error from the images of the first alignment mark of the first substrate and the third alignment mark of the first holder, acquired from the camera unit.

A second substrate may be positioned and aligned in a second holder, and the analyzer may analyze the second alignment error from the images of the second alignment mark of the second substrate and the fourth alignment mark of the second holder, acquired from the second camera unit.

The adhesive surfaces of the first substrate and the second substrate may be positioned to face each other, and in this case, the analyzer may analyze positions from the images of the third alignment mark and the fourth alignment mark, acquired through the camera unit.

The first substrate and the second substrate may be aligned by driving the driver to match the first alignment mark and the second alignment mark and to bring the first alignment mark and the second alignment mark into close contact with each other in consideration of the first alignment error and the second alignment error.

Although the present invention has been described in detail through specific embodiments, this is for explaining the present invention in detail, and the present invention is not limited thereto, and it would be obvious to one of ordinary skill in the art that the present invention may be modified and improved within the scope of the present invention.

All simple modifications and changes of the present invention belong to the scope of the present invention, and the specific scope of the present invention would be obvious based on the appended claims.

DESCRIPTION OF REFERENCE NUMERALS

| | |
|---|---|
| 100: First substrate | 110: first adhesive surface |
| 120: first non-adhesive surface | 130: first alignment mark |
| 200: second substrate | 210: second adhesive surface |
| 220: second non-adhesive surface | 230: second alignment mark |
| 300: first holder | 310: first accommodation surface |
| 320: first outer surface | 330: third alignment mark |
| 400: second holder | 410: second accommodation surface |
| 420: second outer surface | 430: fourth alignment mark |
| 500: first camera unit | 510: second camera unit |
| 520: third camera unit | 530: analyzer |
| 540: transparent hole | 550: driver |

The invention claimed is:

1. A substrate alignment apparatus comprising,
a first substrate (100) and a second substrate (200) being bonded to each other, and the first substrate (100) and the second substrate (200) being classified into adhesive surfaces that are bonded to each other while the first substrate (100) and the second substrate (200) face each other and non-adhesive surfaces positioned at opposite sides of the adhesive surfaces:
the first substrate (100) including a first adhesive surface (110) and a first non-adhesive surface (120) positioned at an opposite side to a first adhesive surface (110);
the second substrate (200) including a second adhesive surface (210) and a second non-adhesive surface (220) positioned at an opposite side to a second adhesive surface (210);
a first holder (300) formed to accommodate the first non-adhesive surface (120) of the first substrate (100) thereon;
a second holder (400) formed to accommodate the second non-adhesive surface (220),
one or more first alignment marks (130) formed on the first adhesive surface (110) of the first substrate (100);
one or more second alignment marks (230) formed on the second adhesive surface (210) of the second substrate (200);
one or more third alignment marks (330) formed at predetermined positions of the first holder (300);
one or more fourth alignment marks (430) formed at predetermined positions of the second holder (400),
a first camera unit (500) configured to acquire simultaneously images of the first alignment mark (130) and the third alignment mark (330); and
a second camera unit (510) configured to acquire simultaneously images of the second alignment mark (230) and the fourth alignment mark (430); and
an analyzer (530) configured to analyze an alignment error of each alignment mark using the images,
wherein each alignment error is analyzed through the analyzer (530) and the first substrate (100) and the second substrate (200) are aligned by moving the first holder (300) and the second holder (400) closely to each other to bring the first adhesive surface (110) and the second adhesive surface (210) into close contact with each other at desired positions.

2. The substrate alignment apparatus according to claim 1, wherein the first holder (300) includes:

a first accommodation surface (310) formed to accommodate the first non-adhesive surface (120) thereon in a form of a plate for supporting the first substrate (100); and
a first outer surface (320) positioned outside the first accommodation surface (310), wherein the second holder (400) includes:
a second accommodation surface (410) formed to accommodate the second non-adhesive surface (220) thereon in a form of a plate for supporting the second adhesive surface (210) of the second substrate (200); and
a second outer surface (420) positioned outside the second accommodation surface (410),
wherein the first adhesive surface (110) of the first substrate (100) accommodated on the first accommodation surface (310) of the first holder (300) and the second adhesive surface (210) of the second substrate (200) accommodated on the second accommodation surface (410) of the second holder (400) are arranged to face each other, and then the first substrate (100) and the second substrate (200) are aligned by moving the first holder (300) and the second holder (400) closely to each other to bring the first adhesive surface (110) and the second adhesive surface (210) into close contact with each other.

3. The substrate alignment apparatus according to claim 2, wherein:

the first holder (300) and/or the second holder (400) includes a driver (550) for moving the first holder (300) and/or the second holder (400),
when a perpendicular direction to the first accommodation surface (310) of the first holder (300) is a z-axis direction and directions that are positioned in parallel to the first accommodation surface (310) and perpendicular to each other are an x-axis direction and a y-axis direction, the driver (550) compensates for an alignment error analyzed through the analyzer (530) by moving the first holder (300) and/or the second holder (400) in the x-axis, y-axis, and z-axis directions or rotating the first holder (300) and/or the second holder (400) in the z-axis direction, and thus aligns the first substrate (100) and the second substrate (200) by moving the first holder (300) and the second holder (400) closely to each other to bring the first adhesive surface (110) and the second adhesive surface (210) into close contact with each other at desired positions.

4. The substrate alignment apparatus according to claim 3, wherein the analyzer (530) analyzes a first alignment error corresponding to alignment errors of the first alignment mark (130) and the third alignment mark (330) from the images acquired from the first alignment mark (130) and the third alignment mark (330), acquired from the first camera unit (500), analyzes a second alignment error corresponding to alignment errors of the second alignment mark (230) and the fourth alignment mark (430) from the images acquired from the second alignment mark (230) and the fourth alignment mark (430), acquired from the second camera unit (510), analyzes positions of the third alignment mark (330) and the fourth alignment mark (430) through a third camera unit, and then acquires a moving value for moving the first holder (300) and/or the second holder (400) to match the first alignment mark (130) of the first substrate (100) and the second alignment mark (230) of the second substrate (200) in consideration of the first alignment error and the second alignment error, moves the first holder (300) and/or the second holder (400) through the driver (550) by applying the acquired moving value, and aligns the first substrate (100)

and the second substrate (200) to make the first alignment mark (130) of the first adhesive surface (110) and the second alignment mark (230) of the second adhesive surface (210) correspond to each other and be in close contact with each other.

5. The substrate alignment apparatus according to claim 3, wherein the first substrate (100) and the second substrate (200) are opaque, the first alignment mark (130) of the first substrate (100) is formed on the first adhesive surface (110), and the second alignment mark (230) of the second substrate (200) is formed on the second adhesive surface (210), and accordingly, when the first substrate (100) and the second substrate (200) are bonded to each other, the first alignment mark (130) and the second alignment mark (230) are not accurately viewed, and thus a moving value for moving the first holder (300) and/or the second holder (400) is calculated to acquire the images of the first alignment mark (130) and the third alignment mark (330) from the camera unit (500) to analyze a first alignment error, to acquire the images of the second alignment mark (230) and the fourth alignment mark (430) from the camera unit (510) to analyze a second alignment error, and to acquire images of the third alignment mark (330) and the fourth alignment mark (430) from a camera unit (520) to compensate for the first alignment error and the second alignment error.

6. The substrate alignment apparatus according to claim 5, wherein, to simultaneously acquire the images of the third alignment mark (330) and the fourth alignment mark (430), a through hole or a transparent hole (540) filled with a transparent material is formed in a portion at which the third alignment mark (330) of the first holder (300) is formed or a portion at which the fourth alignment mark (430) of the second holder (400) is formed.

\* \* \* \* \*